(12) United States Patent
Park et al.

(10) Patent No.: US 10,862,457 B2
(45) Date of Patent: Dec. 8, 2020

(54) FILTER

(71) Applicant: Samsung Electro-Mechanics Co., Ltd., Suwon-si (KR)

(72) Inventors: Yoon Sok Park, Suwon-si (KR); Hyun Jun Kim, Suwon-si (KR); Sung Tae Kim, Suwon-si (KR); Won Kyu Jeung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/294,048

(22) Filed: Mar. 6, 2019

(65) Prior Publication Data

US 2020/0076407 A1    Mar. 5, 2020

(30) Foreign Application Priority Data

Sep. 4, 2018  (KR) .......................... 10-2018-0105074

(51) Int. Cl.
| | |
|---|---|
| H03H 9/54 | (2006.01) |
| H03H 9/02 | (2006.01) |
| H03H 7/01 | (2006.01) |
| H03H 9/17 | (2006.01) |
| H03H 9/205 | (2006.01) |

(52) U.S. Cl.
CPC .......... *H03H 9/542* (2013.01); *H03H 7/0161* (2013.01); *H03H 9/02007* (2013.01); *H03H 9/171* (2013.01); *H03H 9/205* (2013.01)

(58) Field of Classification Search
CPC .. H03H 9/542; H03H 7/0161; H03H 9/02007; H03H 9/171; H03H 9/205

USPC ......................................................... 333/133
See application file for complete search history.

(56) References Cited

U.S. PATENT DOCUMENTS

| | | |
|---|---|---|
| 2014/0197903 A1 | 7/2014 | Uesaka |
| 2016/0065165 A1 | 3/2016 | Kadota |

(Continued)

FOREIGN PATENT DOCUMENTS

| | | |
|---|---|---|
| JP | 2013-55513 A | 3/2013 |
| JP | 6164292 B2 | 7/2017 |

(Continued)

OTHER PUBLICATIONS

Korean Office Action dated Jul. 26, 2019 in counterpart Korean Patent Application No. 10-2018-0105074 (5 pages in English and 4 pages in Korean).

*Primary Examiner* — Benny T Lee
*Assistant Examiner* — Hafizur Rahman
(74) *Attorney, Agent, or Firm* — NSIP Law

(57) ABSTRACT

A filter includes: a series part disposed between a signal input terminal and a signal output terminal, and including at least one first bulk-acoustic resonator; an inductor portion including a first inductor disposed between ends of the series part and a second inductor having a first end connected to a connection node of the series part and the first inductor; and a shunt part disposed between a second end of the second inductor and a ground, and including at least one second bulk-acoustic resonator, wherein a resonant frequency of the at least one second bulk-acoustic resonator is higher than a resonant frequency of the at least one first bulk-acoustic resonator.

16 Claims, 10 Drawing Sheets

(56) References Cited

U.S. PATENT DOCUMENTS

| | | | |
|---|---|---|---|
| 2016/0191012 A1* | 6/2016 | Khlat | H03H 9/605 333/189 |
| 2016/0294357 A1* | 10/2016 | Tani | H03H 9/605 |
| 2017/0093370 A1 | 3/2017 | Khlat et al. | |
| 2017/0301992 A1* | 10/2017 | Khlat | H03H 9/72 |
| 2018/0076793 A1 | 3/2018 | Khlat et al. | |

FOREIGN PATENT DOCUMENTS

| KR | 10-2005-0031192 A | 4/2005 |
|---|---|---|
| KR | 10-2014-0067075 A | 6/2014 |

* cited by examiner

FILTER

CROSS-REFERENCE TO RELATED APPLICATIONS

This application claims the benefit under 35 USC 119(a) of Korean Patent Application No. 10-2018-0105074 filed on Sep. 4, 2018 in the Korean Intellectual Property Office, the entire disclosure of which is incorporated herein by reference for all purposes.

BACKGROUND

1. Field

The following description relates to a filter.

2. Description of Related Art

Recently, as mobile communications devices, chemical and biological testing devices, and the like have been rapidly developed, demand for compact and lightweight filters, oscillators, resonant elements, and acoustic resonant mass sensors used for such devices has also been growing.

A film bulk acoustic resonator (FBAR) is known as a device for implementing such a compact and lightweight filters, oscillators, resonant elements, and acoustic resonance mass sensors. An FBAR has advantages in that mass production is possible at minimal cost and the FBAR may be implemented in a significantly small size. Moreover, an FBAR may be configured to provide a high quality factor (Q) value, which is a main characteristic of a filter and the FBAR may be used in a microwave frequency band. In detail, the FBAR may be used even in personal communication system (PCS) and digital cordless system (DCS) bands.

In general, an FBAR is formed to have a structure including a resonance part provided by sequentially stacking a first electrode, a piezoelectric layer, and a second electrode on a substrate. In operation of an FBAR, an electric field is induced in the piezoelectric layer by electrical energy applied to the first electrode and the second electrode, a piezoelectric phenomenon occurs in a piezoelectric layer due to the induced electric field, and the resonance part vibrates in a predetermined direction. As a result, bulk acoustic waves are generated in a direction the same as a vibration direction, thereby causing resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a filter includes: a series part disposed between a signal input terminal and a signal output terminal, and including at least one first bulk-acoustic resonator; an inductor portion including a first inductor disposed between ends of the series part and a second inductor having a first end connected to a connection node of the series part and the first inductor; and a shunt part disposed between a second end of the second inductor and a ground, and including at least one second bulk-acoustic resonator, wherein a resonant frequency of the at least one second bulk-acoustic resonator is higher than a resonant frequency of the at least one first bulk-acoustic resonator.

A thickness of an upper electrode of the at least one first bulk-acoustic resonator may be greater than a thickness of an upper electrode of the at least one second bulk-acoustic resonator.

The first inductor and the second inductor may be coupled to each other.

A mutual coupling coefficient of the first inductor and the second inductor may have either one of a positive sign and a negative sign.

In an anti-resonance state of the at least one first bulk-acoustic resonator, a pass path for a radio frequency signal may be formed through the first inductor.

A pass band of the radio frequency signal through the first inductor may depend on the second inductor and the shunt part.

A pass band may be determined by an anti-resonant frequency of the series part and a resonant frequency of the shunt part.

The at least one first bulk-acoustic resonator may include two bulk-acoustic resonators connected to each other in series, and the at least one second bulk-acoustic resonators may include two other bulk-acoustic resonators connected to each other in series.

In another general aspect, a filter includes: a series part disposed between a signal input terminal and a signal output terminal, and including at least one first bulk-acoustic resonator; a shunt part disposed between the series part and a ground, and including at least one second bulk-acoustic resonator; and an inductor portion disposed between the series part and the shunt part, and including at least one inductor, wherein a pass band is determined by an anti-resonant frequency of the series part and a resonant frequency of the shunt part.

A resonant frequency of the at least one second bulk-acoustic resonator may be higher than a resonant frequency of the at least one first bulk-acoustic resonator.

A thickness of an upper electrode of the at least one first bulk-acoustic resonator may be greater than a thickness of an upper electrode of the at least one second bulk-acoustic resonator.

The at least one inductor may include a first inductor disposed between ends of the series part and a second inductor disposed between a connection node, of the series part and the first inductor, and the shunt part.

The first inductor and the second inductor may be coupled to each other.

A mutual coupling coefficient of the first inductor and the second inductor may have either one of a positive sign and a negative sign.

In an anti-resonance state of the series part, a pass path for a radio frequency signal may be formed through the first inductor.

A pass band of the radio frequency signal through the first inductor may depend on the second inductor and the shunt part.

The at least one inductor may include a first inductor and a second inductor connected to each other in series, and a third inductor disposed between the shunt part and a connection node of the first inductor and the second inductor.

The first inductor may be connected to an end of the series part and the second inductor may be connected to another end of the series part.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
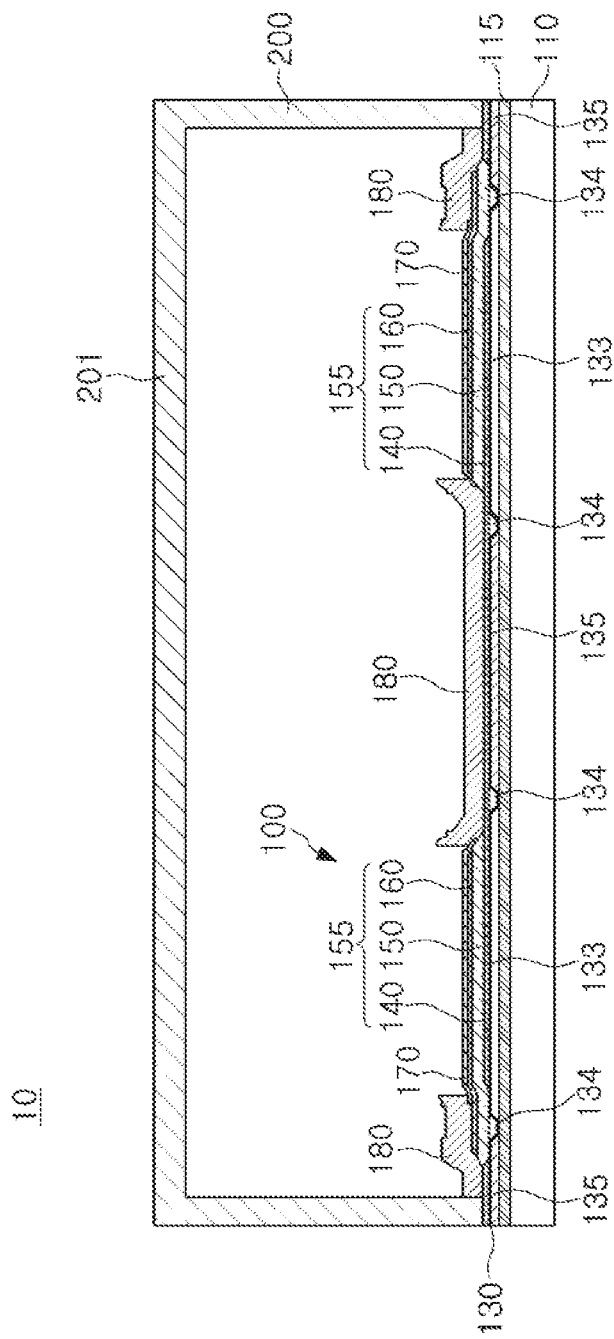
FIG. 1 is a cross-sectional view illustrating a filter, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a cross-sectional view illustrating a filter 10 according to an example.

Referring to the example of FIG. 1, the filter 10 may include at least one bulk-acoustic resonator 100 and a cap 200. In FIG. 1, the filter 10 is illustrated as including two bulk-acoustic resonators 100, but the filter 10 may include one bulk-acoustic resonator 100 or three or more bulk-acoustic resonators 100, according to other examples. The bulk-acoustic resonator 100 may be a film bulk acoustic resonator (FBAR).

The bulk-acoustic resonator 100 may be composed of a multilayer structure formed of a plurality of films. The multilayer structure forming the bulk-acoustic resonator 100 may include a substrate 110, an insulating layer 115, an air cavity 133, a support portion 134, an auxiliary support portion 135, and a resonance part 155. The resonance part 155 includes, for example, a first electrode 140, a piezoelectric layer 150, and a second electrode 160, and may further include a protective layer 170 and a metal layer 180.

An example process of manufacturing the bulk-acoustic resonator 100 will be described. A sacrificial layer is formed on the insulating layer 115 and a portion of the sacrificial layer is removed, thereby forming a pattern in the sacrificial layer. The support portion 134 is provided in the pattern formed in the sacrificial layer. The auxiliary support portion 135 is formed of a remaining portion of the sacrificial layer. A width of an upper surface of the pattern formed in the sacrificial layer may be wider than a width of a lower surface of the pattern, and a side surface of the pattern, which connects the upper surface to the lower surface, may be inclined. After the pattern is formed in the sacrificial layer, a membrane 130 is formed on an insulating layer 115 such that the membrane 130 is externally exposed by the sacrificial layer and the pattern. After the membrane 130 is formed, an etch stop material, which forms a base for formation of the support portion 134, is formed to cover the membrane 130.

After the etch stop material is formed, one surface of the etch stop material is planarized to externally expose a portion of the membrane 130 that is formed on the upper surface of the sacrificial layer. In a process in which one surface of the etch stop material is planarized, a portion of the etch stop material is removed. After the portion of the etch stop material is removed, the support portion 134 may be formed by another portion of the etch stop material remaining in the pattern. As a result of a planarization process of the etch stop material, one surface of the support portion 134 and the sacrificial layer may be substantially flat. The membrane 130 may serve as a stop layer in the planarization process of the etch stop material.

Then, the air cavity 133 may be formed by an etching process in which the first electrode 140, the piezoelectric layer 150, and the second electrode 160 are stacked, and the sacrificial layer is then etched and removed. For example, the sacrificial layer may include polycrystalline silicon (Poly-Si). The air cavity 133 may be located in a lower portion of a resonance part 155 to allow the resonance part 155, including the first electrode 140, the piezoelectric layer 150, and the second electrode 160, to be vibrated in a predetermined direction.

The substrate 110 may be a silicon substrate, and an insulating layer 115 configured to electrically isolate the resonance part 155 from the substrate 110 may be provided in an upper surface of the substrate 110. The insulating layer 115 may be formed of at least one among silicon dioxide (SiO2), silicon nitride (Si3N4), aluminum oxide (Al2O2), and aluminum nitride (AlN), and may be formed on the substrate 110 using chemical vapor deposition, RF magnetron sputtering, or evaporation.

An etch stop layer may be formed on the insulating layer 115. The etch stop layer may protect the substrate 110 and the insulating layer 115 from an etching process, and may be a foundation on which various layers are disposed.

The air cavity 133 and a support portion 134 may be formed on the insulating layer 115. As described above, the air cavity 133 is formed using an etching process in which the sacrificial layer is formed on the insulating layer 115, the pattern provided with the support portion 134 is formed on the sacrificial layer, and the first electrode 140, the piezoelectric layer 150, and the second electrode 160 are stacked, and the sacrificial layer is etched to be removed.

The air cavity 133 may be located in the lower portion of the resonance part 155 to allow the resonance part 155, which includes the first electrode 140, the piezoelectric layer 150, and the second electrode 160, to vibrate in a predetermined direction. The support portion 134 may be provided on one side of the air cavity 133.

A thickness of the support portion 134 may be equal to the thickness of the air cavity 133. Thus, an upper surface, provided by the air cavity 133 and the support portion 134, may be substantially flat. In an example, the resonance part 155 is disposed on a surface from which a step is removed, thereby improving insertion loss and attenuation characteristics of the bulk-acoustic resonator.

A cross section of the support portion 134 may have a substantially trapezoidal shape. In detail, a width of the upper surface of the support portion 134 may be greater than a width of a lower surface of the support portion 134, and a side surface of the support portion 134 connecting the upper surface to the lower surface may be inclined. The support portion 134 may be formed of a material not to be etched in an etching process for removing a sacrificial layer. For example, the support portion 134 may be formed of a material that is the same as the material of the insulating layer 115. For example, the support portion 134 may be formed of either one or both of silicon dioxide ($SiO_2$) and silicon nitride ($Si_3N_4$).

In an example, the side surface of the support portion 134 is formed to be inclined to prevent an abrupt step from occurring in a boundary between the support portion 134 and the sacrificial layer, and the width of the lower surface of the support portion 134 is formed to be narrow to prevent a dishing phenomenon from occurring. For example, an angle formed by the lower surface and the side surface of the support portion 134 may be 110° to 160°, and the width of the lower surface of the support portion 134 may be 2 μm to 3 μm.

The auxiliary support portion 135 may be provided outside of the support portion 134. The auxiliary support portion 135 may be formed of the same material as that of the support portion 134, or may be formed of a material different from that of the support portion 134. For example, when the auxiliary support portion 135 and the support portion 134 are formed of different materials, the auxiliary support portion 135 may correspond to a portion of the sacrificial layer remaining after an etching process and formed on the insulating layer 115.

The resonance part 155 may include the first electrode 140, the piezoelectric layer 150, and the second electrode 160. A common region in which the to the first electrode 140, the piezoelectric layer 150, and the second electrode 160 are overlapped in a direction perpendicular to the first electrode 140, the piezoelectric layer 150, and the second electrode 160, may be located in an upper portion of the air cavity 133. The first electrode 140 and the second electrode 160 may be formed of gold (Au), titanium (Ti), tantalum (Ta), molybdenum (Mo), ruthenium (Ru), platinum (Pt), tungsten (W), aluminum (Al), iridium (Ir), nickel (Ni), or alloys thereof. The piezoelectric layer 150 is a portion causing a piezoelectric effect to convert electrical energy into mechanical energy in the form of elastic waves, and may be formed of zinc oxide (ZnO), aluminum nitride (AlN), doped aluminum nitride, lead zirconate titanate, quartz, or the like. In the case of the piezoelectric layer 150 being formed of doped aluminum nitride, rare earth metal transition metal, or alkaline earth metal may be further included. For example, the rare earth metal may include at least one among scandium (Sc), erbium (Er), yttrium (Y), and lanthanum (La), and the content of the rare earth may be 1 at % to 20 at %. The transition metal may include at least one among hafnium (Hf), titanium (Ti), zirconium (Zr), tantalum (Ta), and niobium (Nb). Moreover, the alkaline earth metal may include magnesium (Mg).

The membrane 130 is formed of a material that may not be easily removed in a process for forming the cavity 133. For example, in order to form the cavity 133, when a halide-based etching gas such as fluorine (F), chlorine (Cl), or the like, is used to remove a portion of the sacrificial layer, the membrane 130 may be formed of a material having a low reactivity with the etching gas. In such an example, the membrane 130 may include at least one of silicon dioxide ($SiO_2$) and silicon nitride ($Si_3N_4$). Moreover, the membrane 130 may be formed of a dielectric layer containing a material of at least one among magnesium oxide (MgO), zirconium oxide (ZrO2), aluminum nitride (AlN), lead titanate zirconate (PZT), gallium arsenide (GaAs), hafnium oxide (HfO2), aluminum oxide (Al2O3), titanium oxide (TiO2), and zinc oxide (ZnO), and may be formed of a metal layer containing a material of at least one among aluminum (Al), nickel (Ni), chromium (Cr), platinum (Pt), gallium (Ga), and hafnium (Hf).

According to an example, a seed layer formed of aluminum nitride (AlN) may be formed on the membrane 130. For example, the seed layer may be disposed between the membrane 130 and the first electrode 140. The seed layer may be formed of dielectric or metal having a hexagonal close-packed (HCP) structure, other than aluminum nitride (AlN). In the case of the seed layer being formed of metal, the seed layer may be formed of titanium (Ti), by way of example.

The protective layer 170 is disposed on the second electrode 160, and may prevent the second electrode 160 from being exposed externally. The protective layer 170 may be formed of an insulating material of one among a silicon oxide series, a silicon nitride series, an aluminum nitride series, and an aluminum oxide series. A metal layer 180 may be formed on externally exposed portions of the first electrode 140 and the second electrode 160.

The resonance part 155 may include an active region and an inactive region. The active region of the resonance part 155 is a region resonated by vibrating in the predetermined direction by the piezoelectric phenomenon occurring in the piezoelectric layer 150 when electrical energy, such as a radio frequency signal, is applied to the first electrode 140 and the second electrode 160. The active region is a region in which the first electrode 140, the piezoelectric layer 150, and the second electrode 160 are overlapped in a vertical direction in an upper portion of the air cavity 133. The inactive region of the resonance part 155 is a region not resonated by the piezoelectric phenomenon even when electrical energy is applied to the first electrode 140 and the second electrode 160, and is a region located outside of the active region.

The resonance part 155 outputs a radio frequency signal having a certain frequency using the piezoelectric phenomenon. In detail, the resonance part 155 outputs a radio frequency signal having a resonant frequency corresponding to a vibration according to the piezoelectric phenomenon of the piezoelectric layer 150.

The cap 200 may be bonded to a multilayer structure forming the plurality of bulk-acoustic resonators 100. The cap 200 may have a form of a cover having an internal space in which the bulk-acoustic resonators 100 are accommodated. The cap 200 may have a form of a hexahedral shape of which a lower surface of the cap 200 is open, and thus may include an upper portion and a plurality of side portions connected to the upper portion.

The cap 200 may have an accommodating portion in the center thereof configured to accommodate the resonance part 155 of the bulk-acoustic resonators 100. The multilayer structure may be bonded to the side portions in a bonded region, and the bonded region of the multilayer structure may correspond to an edge of the multilayer structure. The cap 200 may be bonded to a substrate 110. In addition, the cap 200 may also be bonded to at least one among the protective layer 170, the membrane 130, the insulating layer 115, the first electrode 140, the piezoelectric layer 150, the second electrode 160, and the metal layer 180.

Figure 2:
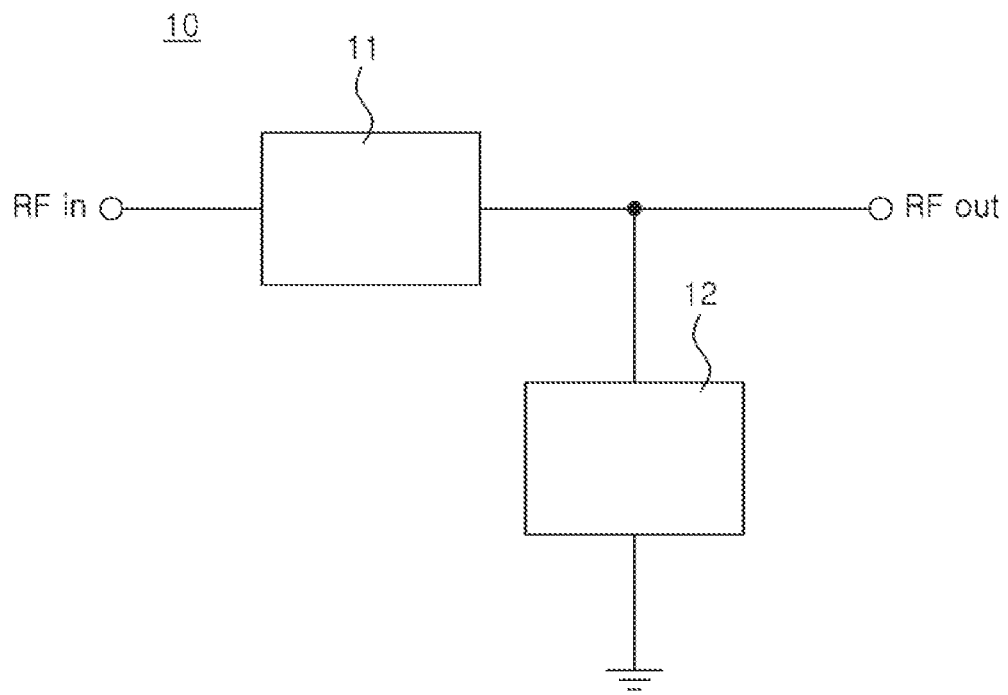
FIG. 2 is a block diagram of a filter, according to an example.

FIG. 2 is an block diagram of the filter 10, according to an example. Referring to the example of FIG. 2, the filter 10 may include at least one series part 11 and at least one shunt part 12 disposed between the at least one series part 11 and a ground. As illustrated in FIG. 2, the filter 10 may have a ladder-type filter structure or a lattice-type filter structure.

The at least one series part 11 is disposed between a signal input terminal RFin to which an input signal is input and a signal output terminal RFout from which an output signal is output, and the at least one shunt part 12 is disposed between the at least one series part 11 and the ground. Each of the at least one series part 11 and the at least one shunt part 12 includes at least one bulk-acoustic resonator 100 illustrated in FIG. 1.

For example, when the series part 11 includes a plurality of bulk-acoustic resonators, and the shunt part 12 includes a plurality of bulk-acoustic resonators, each plurality of bulk-acoustic resonators may include some bulk-acoustic resonators connected to each other in series and some bulk-acoustic resonators connected to each other in parallel, according to an example. Moreover, the plurality of bulk-acoustic resonators included in the shunt part 12, may be disposed between a node of the plurality of bulk-acoustic resonators included in the series part 11 and a ground.

Figure 3:
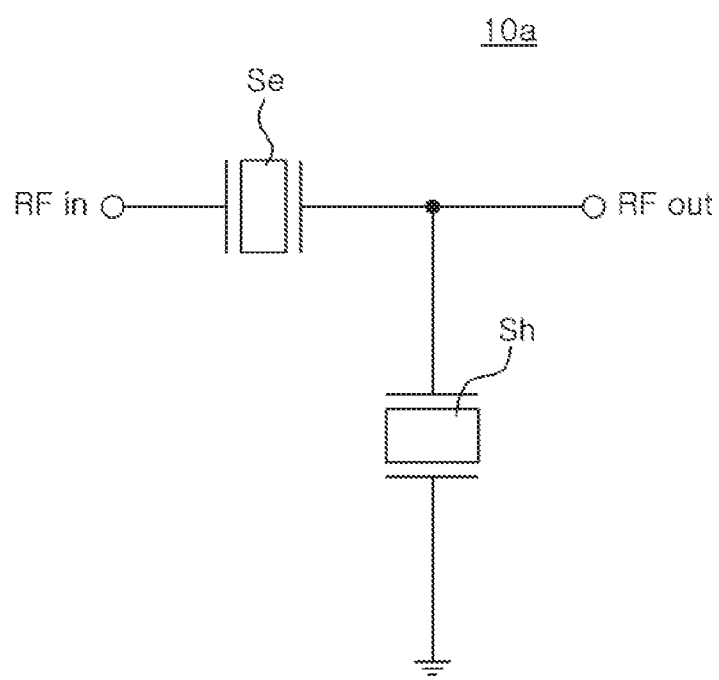
FIG. 3 is a circuit diagram of a filter, according to an example.
Figure 4:
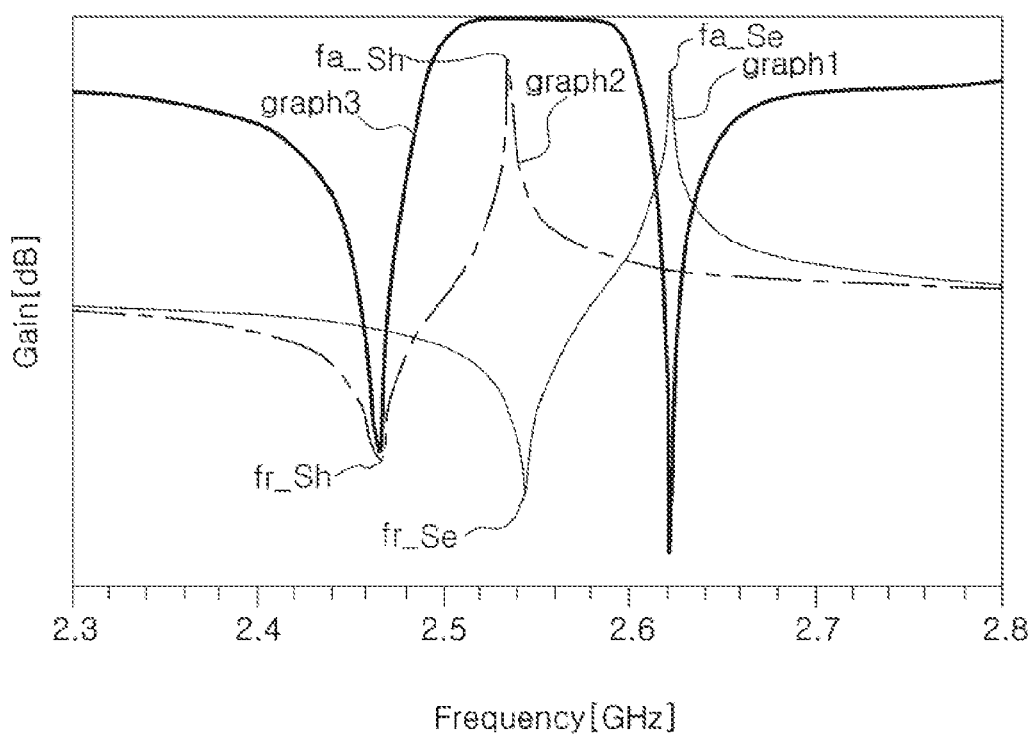
FIG. 4 illustrates a frequency response of the filter of the example of FIG. 3.

FIG. 3 is a circuit diagram of a filter 10a, and FIG. 4 illustrates a frequency response of the filter 10a of FIG. 3.

Referring to the example of FIG. 3, the filter 10a may include a series resonator Se disposed between a signal input terminal RFin and a signal output terminal RFout, and a shunt resonator Sh disposed between the series resonator Se and a ground.

Referring to the example of FIG. 4, graph 1 illustrates a frequency response (Z, impedance) due to the series resonator Se, graph 2 illustrates a frequency response (Z, impedance) due to the shunt resonator Sh, and graph 3 illustrates a frequency response (S-parameter) due to the filter 10a including the series resonator Se and the shunt resonator Sh.

The frequency response due to the series resonator Se has a resonant frequency fr_Se and an anti-resonant frequency fa_Se, while the frequency response due to the shunt resonator Sh has a resonant frequency fr_Sh and an anti-resonant frequency fa_Sh.

Referring to the frequency response of the filter 10a, a bandwidth of the filter 10a is determined according to the anti-resonant frequency fa_Se of the series resonator Se and the resonant frequency fr_Sh of the shunt resonator Sh.

To implement the filter 10a as a bandpass filter, in general, the resonant frequency fr Se of the series resonator Se is designed to be higher than the resonant frequency fr_Sh of the shunt resonator Sh, and the anti-resonant frequency fa_Se of the series resonator Se is designed to be higher than the anti-resonant frequency fa_Sh of the shunt resonator Sh.

Recently, as various frequency bands are used in wireless communications, it is expected that a high frequency band such as a band of 3.5 GHZ to 6 GHZ will be used, in addition to a low frequency band such as a band of 2 GHZ to 2.5 GHZ according to the related art. Moreover, it is expected that a wide pass band of 500 MHz or more will be used compared to a pass band of 100 MHz to 200 MHz according to the related art. To increase a frequency of a pass band of a filter, a thickness of a resonance part adapted to a filter is required to be reduced. However, if the thickness of the resonance part is reduced, it is difficult to maintain the orientation of the piezoelectric layer, and an effective electromechanical coupling coefficient is reduced. Thus, a problem in which filtering characteristics of a filter are reduced may occur.

In the filter according to an example, a resonant frequency of a shunt resonator is designed to be higher than a resonant frequency of a series resonator, and the shunt resonator is connected to both ends of the series resonator through inductors coupled to each other, so a filter having a wide pass band with a high frequency may be implemented.

Figure 5:
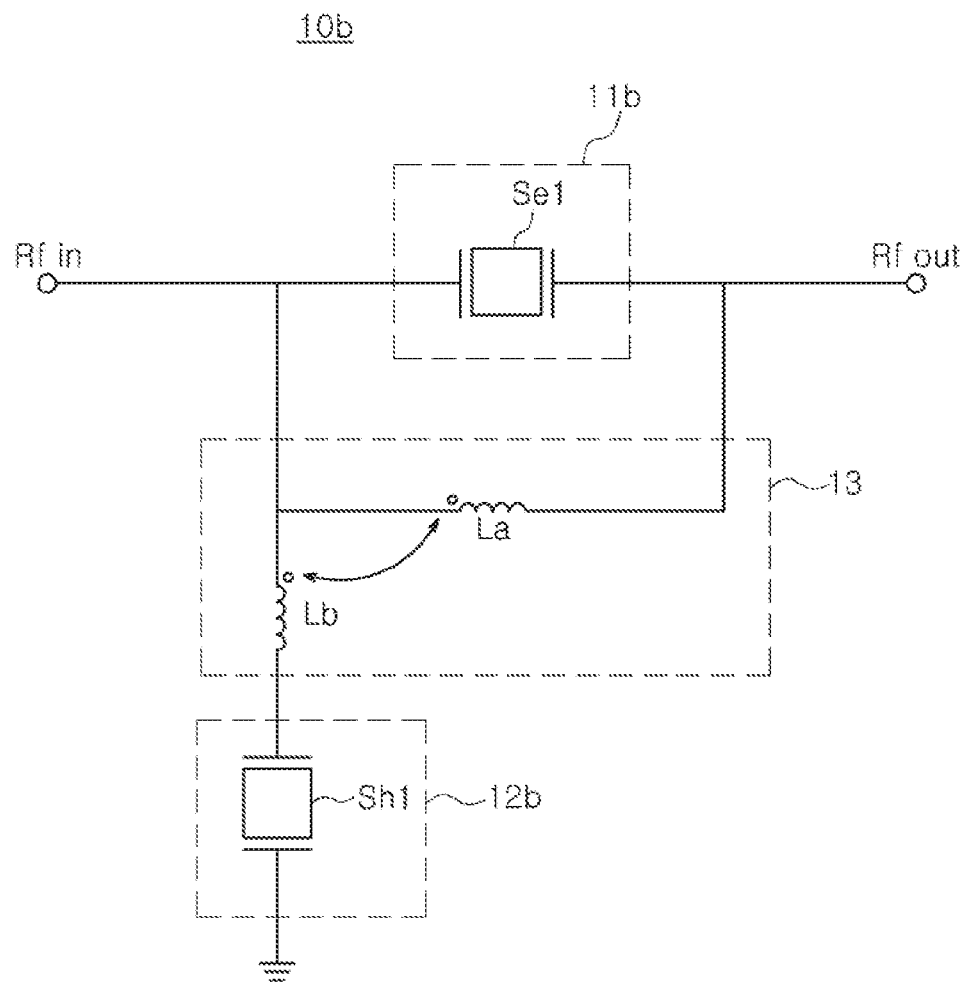
FIGS. 5 to 7 are circuit diagrams of filters, according to various examples.
Figure 6:
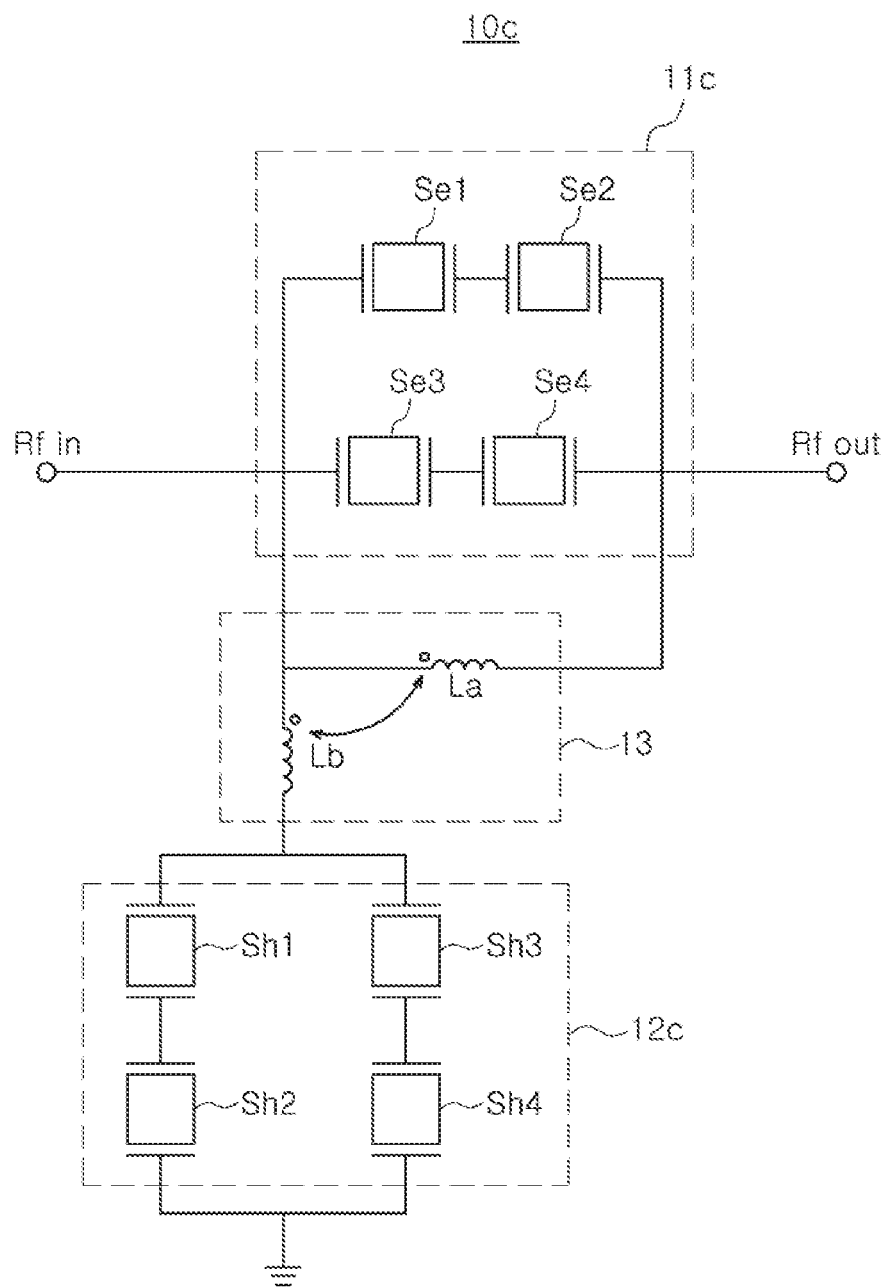
Figure 7:
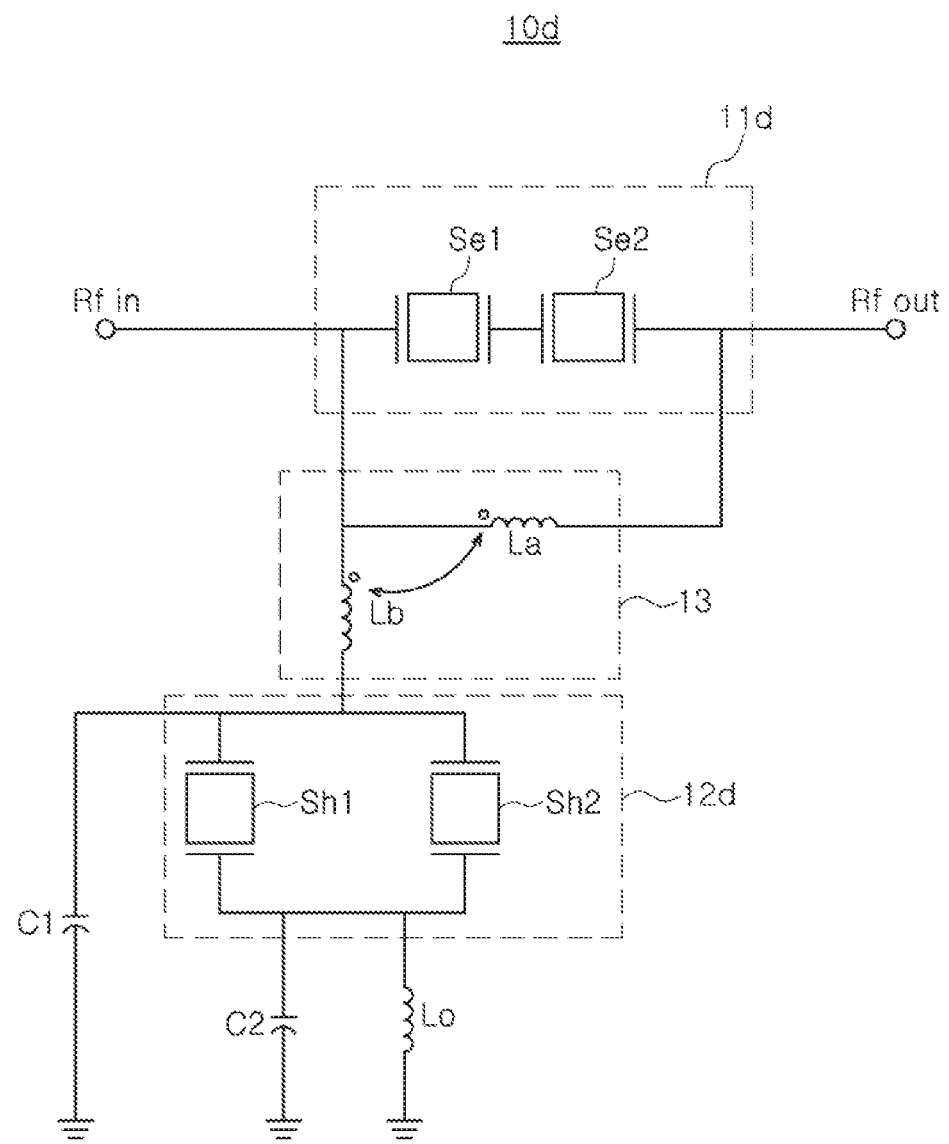

FIGS. 5 to 7 are circuit diagrams of filters, according to various examples.

Referring to the example of FIGS. 5 to 7, a filter 10b/10c/10d may include a series part 11b/11c/11d disposed between a signal input terminal RFin and a signal output terminal RFout, a shunt part 12b/12c/12d disposed between the series part 11b/11c/11d and a ground, and an inductor portion 13 disposed between the series part 11b/11c/11d and the shunt part 12b/12c/12d.

The series part 11b/11c/11d may include at least one series resonator, and the shunt part 12b/12c/12d may include at least one shunt resonator. According to an example, a resonant frequency of a series resonator is designed to be lower than a resonant frequency of a shunt resonator, and an anti-resonant frequency of a series resonator is designed to be lower than an anti-resonant frequency of a shunt resonator. For example, to design the resonant frequency and the anti-resonant frequency as described above, an upper electrode (e.g., the second/upper electrode 160 illustrated in FIG. 1) of a series resonator is manufactured to be thicker than an upper electrode (e.g., the second/upper electrode 160 illustrated in FIG. 1) of a shunt resonator.

Referring to the example of FIG. 5, in the filter 10b, a series part 11b may include a single series resonator Se1, and a shunt part 12b may include a single shunt resonator Sh1.

Alternatively, referring to the example of FIG. 6, in the filter 10c, a series part 11c may include a plurality of series resonators Se1 to Se4, and a shunt part 12c may include a plurality of shunt resonators Sh1 to Sh4. Among the series resonators Se1 to Se4, the first series resonator Se1 and the second series resonator Se2 are connected to each other in series, and the third series resonator Se3 and the fourth series resonator Se4 are connected to each other in series. Additionally, the first series resonator Se1 and the second series resonator Se2 are connected in parallel with the third series resonator Se3 and the fourth series resonator Se4, and vice-versa. Among the shunt resonators Sh1 to Sh4, the first shunt resonator Sh1 and the second shunt resonator Sh2 are connected to each other in series, and the third shunt resonator Sh3 and the fourth shunt resonator Sh4 are connected to each other in series. Additionally, the first shunt resonator Sh1 and the second shunt resonator Sh2 are connected in parallel with the third shunt resonator Sh3 and the fourth shunt resonator Sh4, and vice versa.

Moreover, referring to the example of FIG. 7, in the filter 10d, a series part 11d may include a plurality of series resonators Se1 and Se2, and a shunt part 12d may include a plurality of shunt resonators Sh1 and Sh2. The first series resonator Se1 and the second series resonator Se2 are connected to each other in series, and the first shunt resonator Sh1 and the second shunt resonator Sh2 are connected to each other in parallel. In addition, referring to the example of FIG. 7, an inductor Lo and capacitors C1 and C2 may be provided between the shunt part 12d and the ground to adjust a resonant frequency and an anti-resonant frequency of the shunt part 12d.

The inductor portion 13 may include a first inductor La disposed between both ends of the series part 11b/11c/11d, and a second inductor Lb disposed between the shunt part 12b/12c/12d and a connection node of the series part 11b/11c/11d and the first inductor La. The first inductor La and the second inductor Lb are coupled to each other, and a mutual coupling coefficient of the first inductor La and the second inductor Lb may have one of a positive sign and a negative sign.

Referring to the examples of FIGS. 5 to 7, a radio frequency signal, passing through the signal input terminal RFin and the signal output terminal RFout, may pass through not only a series resonator of the series part 11/11c/11d, but also the first inductor La. A band of a radio frequency signal through the first inductor La is effected by the second inductor Lb coupled to the first inductor La, and is effected by a shunt resonator of the shunt part 12/12c/12d disposed between the second inductor Lb and the ground. In other words, a pass band of a radio frequency signal through the first inductor La may depend on the second inductor Lb and the shunt part 12/12c/12d.

Figure 8:
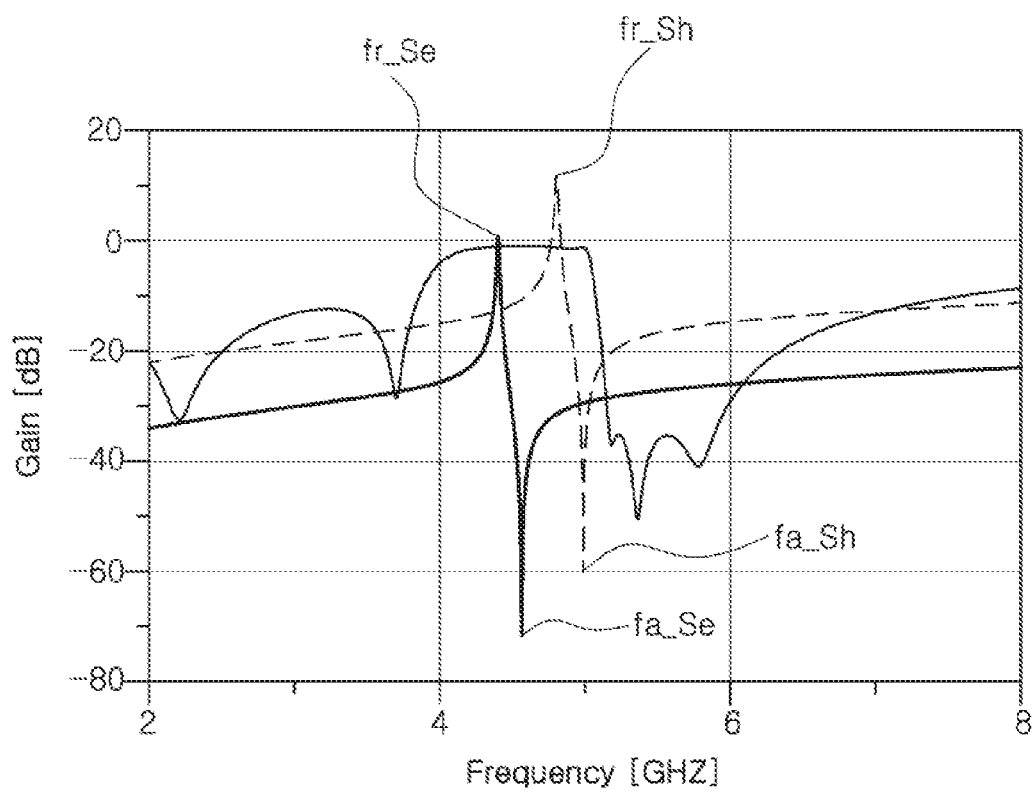
FIG. 8 illustrates a frequency response of the filter of the example of FIG. 7.

FIG. 8 illustrates a frequency response of the filter 10d of the example of FIG. 7.

When comparing a frequency response of FIG. 4 with a frequency response of FIG. 8, in a manner different from the example of FIG. 4, a right skirt of a pass band according to the example of FIG. 8 is determined according to an anti-resonant frequency fa_Sh of a shunt part Sh and a left skirt depends on a resonant frequency of a series part Se.

A filter 10b/10c/10d according to an example forms an additional path through a first inductor La coupled to a combination of the second inductor Lb and a shunt resonator of the shunt part 12/12c/12d, in detail, a first inductor La coupled to a second inductor Lb, in addition to a unique path by a series resonator of a series part 11/11c/11d. When a series resonator of the series part 11/11c/11d is in an anti-resonance state, a path by the series resonator of the series part 11/11c/11d is blocked, and a radio frequency signal may pass through an additional path through the first inductor La.

Figure 9:
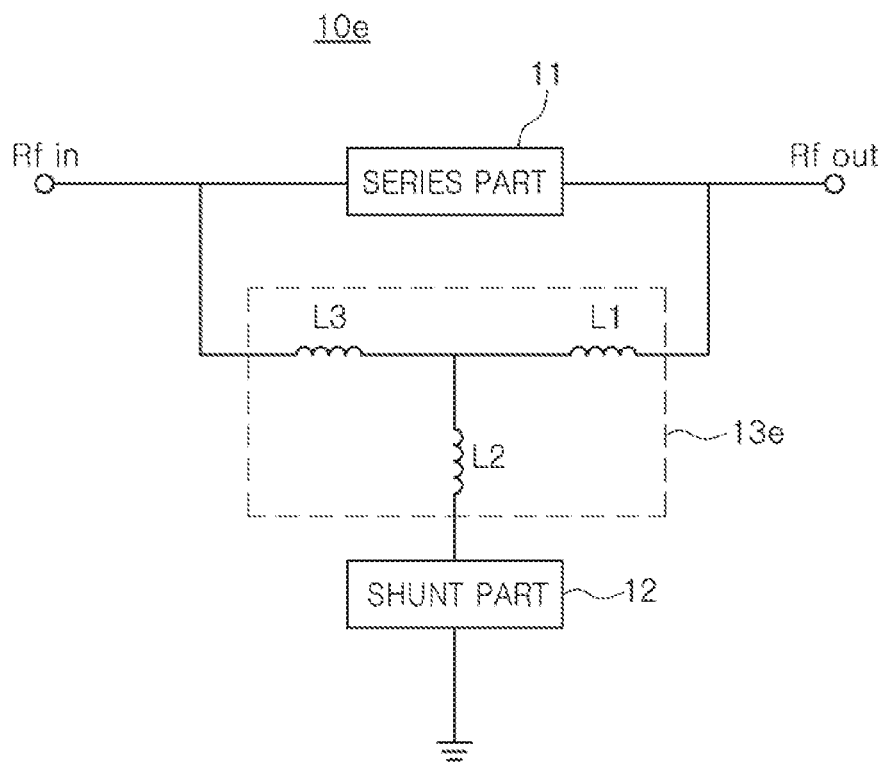
FIG. 9 is a circuit diagram of a filter, according to an embodiment, and is a modification of the circuit diagrams of the examples of FIGS. 5 to 7.

FIG. 9 is a circuit diagram of a filter 10e, and is a modification of the circuit diagrams of the examples of FIGS. 5 to 7.

Referring to the example of FIG. 9, an inductor portion 13e may include an inductor L1 and an inductor L3 connected to each other in series, and an inductor L2 disposed between the shunt part 13 and a connection node of the inductor L1 and the inductor L3, between both ends of the series part 11. In this example, inductances of the inductors L1, L2, and L3 may be expressed by Equation 1. In Equation 1, Lm is a mutual inductance by the first inductor La and the second inductor Lb of FIGS. 5 to 7, and k is a mutual coupling coefficient of the first inductor La and the second inductor Lb. In Equation 1, L1, L2, L3, La, and Lb represent inductances of the inductors L1, L2, L3, La, and Lb, respectively.

$L1 = La - Lm$ $L2 = Lb - Lm$ $L3 = Lm = k^2 \sqrt{La * Lb}$ [Equation 1]

Referring to Equation 1, according to the inductance of the inductors La, Lb, and Lm, the inductances of the inductors L1 and L2 may have one of a positive value and a negative value.

Figure 10:
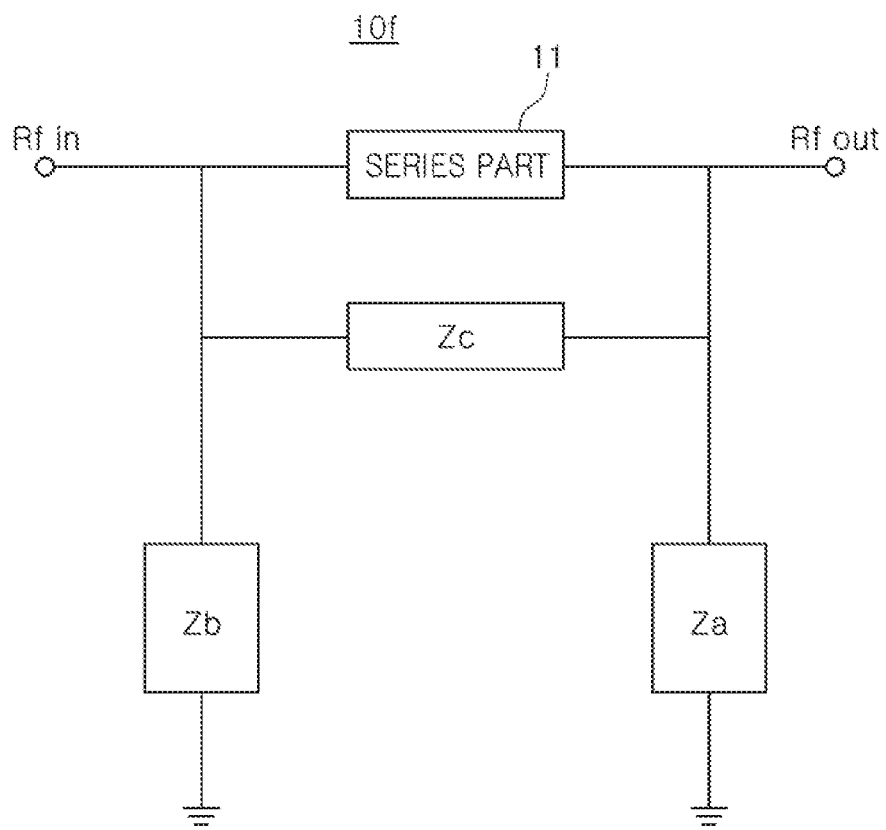
FIG. 10 is a circuit diagram of a filter, according to an embodiment, and is a modification of the circuit diagram of FIG. 9.

FIG. 10 is a modified circuit diagram of a filter 10f, and is a modification of the circuit diagram of the example of FIG. 9.

Referring to the example of FIG. 10, the filter 10e of the example of FIG. 9 may be converted into the filter 10f of the example of FIG. 10 by Y-D conversion. The filter of the example of FIG. 10 may include an impedance Za disposed between one end of the series part 11 and a ground, an impedance Zb disposed between the other end of the series part 11 and the ground, and an impedance Zc connected to the series part 11 in parallel.

In the example of FIG. 10, the impedance Za, the impedance Zb, and the impedance Zc may be determined according to Equation 2. In Equation 2, Zsh may be understood as a configuration including the shunt part and the inductor L2 of the example of FIG. 9.

$$Z_a = jwL1 + \left(1 + \frac{L1}{L3}\right) * Zsh$$

$$Z_b = jwL3 + \left(1 + \frac{L3}{L1}\right) * Zsh$$

$$Z_c = jwL1 + jwL3 - \frac{wL1 * wL3}{Zsh}$$

[Equation 2]

Referring to the example of FIG. 10 and Equation 2, a pass band of the filter is formed by the series part 11 and the impedance Zc.

FIGS. 11 to 15 illustrate a frequency response of the filter 10f of the example of FIG. 10.

Figure 11:
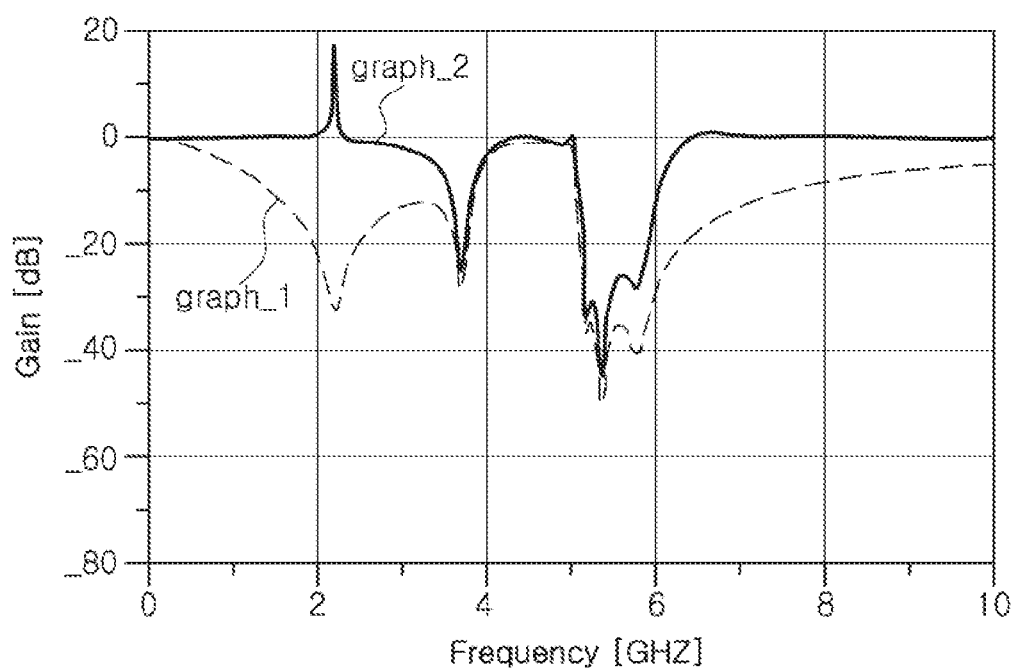
FIGS. 11 to 15 illustrate a frequency response of the filter of the example of FIG. 10.
Figure 12:
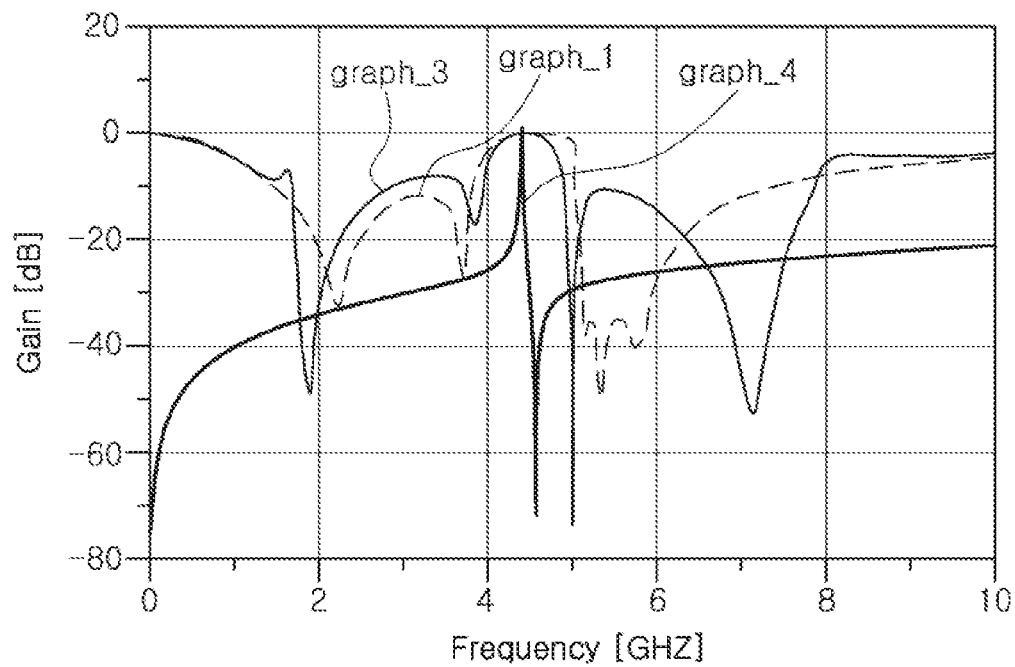

In FIG. 11, graph_1 illustrates a frequency response (S-parameter) of the entirety of the filter 10f of the example of FIG. 10, and graph_2 illustrates a frequency response (S-parameter) in the case in which an impedance Za and an impedance Zb are open, among components of the filter 10f. Graph_3 illustrates a frequency response (S-parameter) in the case in which—(wL1*wL3)/Zsh of an impedance Zc, among components of the filter 10f, is only short-circuited to exclude (wL1*wL3)/Zsh, and graph_4 illustrates a frequency response (admittance) of a series part, among components of the filter 10f.

Figure 13:
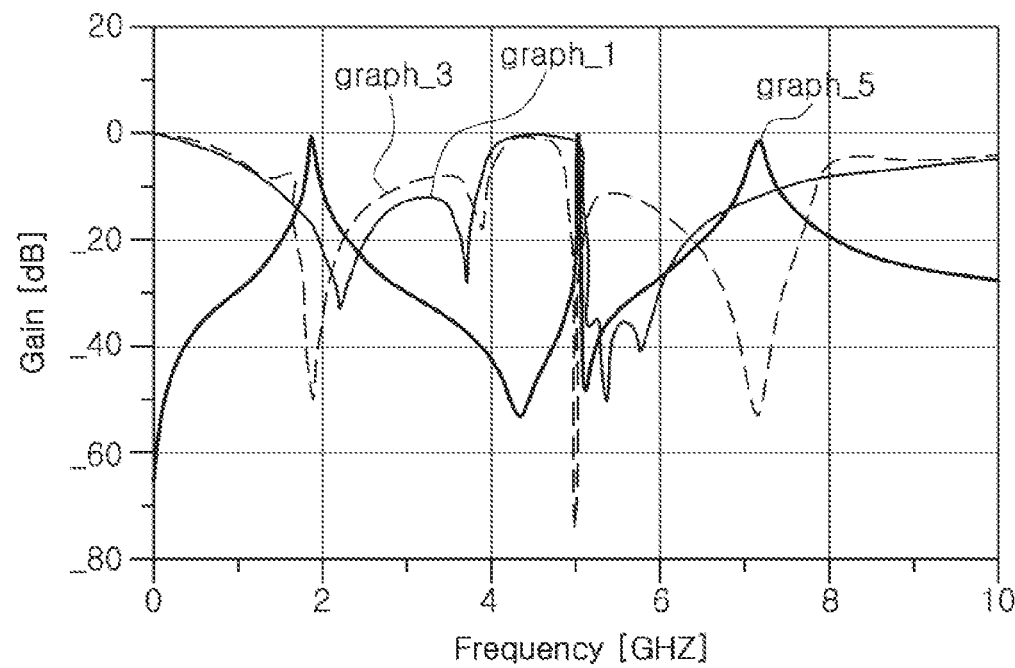
Figure 14:
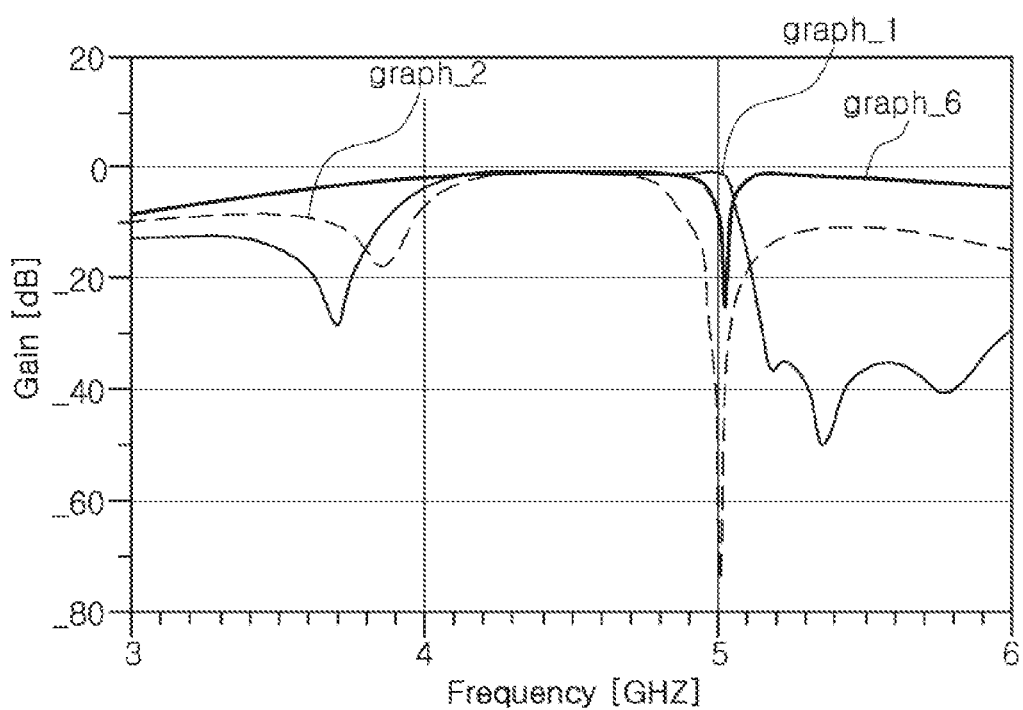

Graph_5 in FIG. 13 illustrates an independent frequency response (admittance) of the shunt part Za, among components of the filter 10f, and graph_6 illustrates a frequency response when a series part, among components of the filter 10f, is open.

Figure 15:
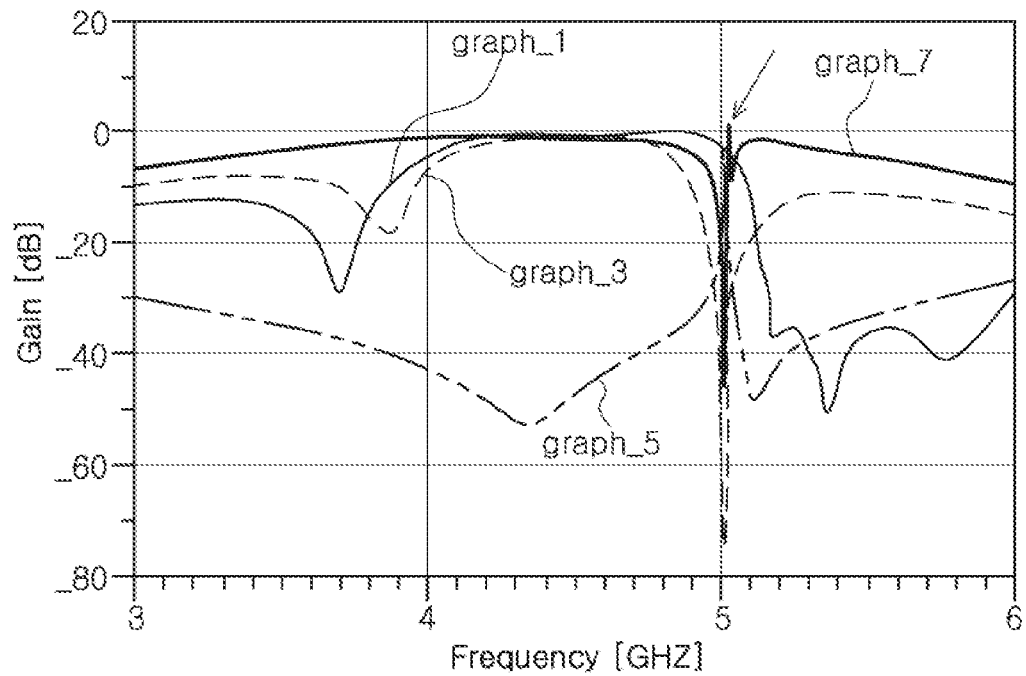

Moreover, graph_7 in FIG. 15 illustrates a frequency response (S-parameter) in the case in which the inductors L1 amd L2, provided in the impedance Zc, among components of the filter 10f, are short-circuited.

When comparing graph_1 with graph_2, pass bands of graph_1 and graph_2 are the same. Thus, it is confirmed that a pass band of the filter 10f is determined by the series resonator of the series part 11 and the impedance Zc.

When comparing graph_1 with graph_3, there is a difference between a pass band of graph_1 and a pass band of graph_3. In other words, due to the impedance Zc, it is confirmed that there is a difference between pass bands of graph_1 and graph_3.

On the other hand, referring to graph_4, it is confirmed that a resonant frequency of a series part is located in a pass band.

Referring to graph_5, a right skirt is formed by a pole point of Za of FIG. 10. Referring to graph_6, an additional pass band is formed by Zc to the right side of graph_2. Referring to Graph_7, it is confirmed that a convex portion near 5 GHz of graph_1 is formed by a resonance peak of −1/Zsh of the impedance Zc. In other words, when Zsh is 0, an infinite negative impedance is formed, so an additional pass path is formed.

As set forth above, according to examples, a filter having a wide pass band with a high frequency may be implemented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A filter, comprising:
    a series part disposed between a signal input terminal and a signal output terminal, and comprising at least one first bulk-acoustic resonator;
    an inductor portion comprising a first inductor disposed between ends of the series part and a second inductor having a first end connected to a connection node of the series part and the first inductor; and
    a shunt part disposed between a second end of the second inductor and a ground, and comprising at least one second bulk-acoustic resonator,
    wherein a resonant frequency of the at least one second bulk-acoustic resonator is higher than a resonant frequency of the at least one first bulk-acoustic resonator, and
    wherein the first inductor and the second inductor are coupled to each other.

2. The filter of claim 1, wherein a thickness of an upper electrode of the at least one first bulk-acoustic resonator is greater than a thickness of an upper electrode of the at least one second bulk-acoustic resonator.

3. The filter of claim 1, wherein a pass band is determined by an anti-resonant frequency of the series part and a resonant frequency of the shunt part.

4. The filter of claim 1, wherein a mutual coupling coefficient of the first inductor and the second inductor has either one of a positive sign and a negative sign.

5. The filter of claim 1, wherein, in an anti-resonance state of the at least one first bulk-acoustic resonator, a pass path for a radio frequency signal is formed through the first inductor.

6. The filter of claim 5, wherein a pass band of the radio frequency signal through the first inductor depends on the second inductor and the shunt part.

7. A filter, comprising:
a series part disposed between a signal input terminal and a signal output terminal, and comprising at least one first bulk-acoustic resonator;
an inductor portion comprising a first inductor disposed between ends of the series part and a second inductor having a first end connected to a connection node of the series part and the first inductor; and
a shunt part disposed between a second end of the second inductor and a ground, and comprising at least one second bulk-acoustic resonator,
wherein a resonant frequency of the at least one second bulk-acoustic resonator is higher than a resonant frequency of the at least one first bulk-acoustic resonator, and
wherein the at least one first bulk-acoustic resonator comprises two bulk-acoustic resonators connected to each other in series, and the at least one second bulk-acoustic resonator comprises two other bulk-acoustic resonators connected to each other in series.

8. A filter, comprising:
a series part disposed between a signal input terminal and a signal output terminal, and comprising at least one first bulk-acoustic resonator;
a shunt part disposed between the series part and a ground, and comprising at least one second bulk-acoustic resonator; and
an inductor portion disposed between the series part and the shunt part, and comprising at least one inductor,
wherein a pass band is determined by an anti-resonant frequency of the series part and a resonant frequency of the shunt part, and
wherein a thickness of an upper electrode of the at least one first bulk-acoustic resonator is greater than a thickness of an upper electrode of the at least one second bulk-acoustic resonator.

9. The filter of claim 8, wherein a resonant frequency of the at least one second bulk-acoustic resonator is higher than a resonant frequency of the at least one first bulk-acoustic resonator.

10. The filter of claim 8, wherein the at least one inductor comprises a first inductor and a second inductor connected to each other in series, and a third inductor disposed between the shunt part and a connection node of the first inductor and the second inductor.

11. The filter of claim 10, wherein the first inductor is connected to an end of the series part and the second inductor is connected to another end of the series part.

12. The filter of claim 9, wherein the at least one inductor comprises a first inductor disposed between ends of the series part and a second inductor disposed between a connection node, of the series part and the first inductor, and the shunt part.

13. The filter of claim 12, wherein the first inductor and the second inductor are coupled to each other.

14. The filter of claim 13, wherein a mutual coupling coefficient of the first inductor and the second inductor has either one of a positive sign and a negative sign.

15. The filter of claim 12, wherein, in an anti-resonance state of the series part, a pass path for a radio frequency signal is formed through the first inductor.

16. The filter of claim 15, wherein a pass band of the radio frequency signal through the first inductor depends on the second inductor and the shunt part.

* * * * *